United States Patent
Lee et al.

(10) Patent No.: US 9,121,106 B2
(45) Date of Patent: Sep. 1, 2015

(54) METHOD OF FORMING A LAMINATED MAGNETIC CORE WITH SPUTTER DEPOSITED AND ELECTROPLATED LAYERS

(75) Inventors: Dok Won Lee, Mountain View, CA (US); Andrei Papou, San Jose, CA (US); William French, San Jose, CA (US); Peter J. Hopper, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 522 days.

(21) Appl. No.: 13/407,352

(22) Filed: Feb. 28, 2012

(65) Prior Publication Data

US 2013/0224887 A1    Aug. 29, 2013

(51) Int. Cl.
| | |
|---|---|
| H01L 21/00 | (2006.01) |
| C25D 7/12 | (2006.01) |
| H01F 10/26 | (2006.01) |
| H01F 41/26 | (2006.01) |
| C23C 14/06 | (2006.01) |
| C23C 14/18 | (2006.01) |
| C25D 7/00 | (2006.01) |
| H01F 3/00 | (2006.01) |
| H01F 27/24 | (2006.01) |
| C23C 28/00 | (2006.01) |
| H01F 41/04 | (2006.01) |

(52) U.S. Cl.
CPC ............ *C25D 7/123* (2013.01); *C23C 14/0617* (2013.01); *C23C 14/185* (2013.01); *C23C 28/321* (2013.01); *C23C 28/34* (2013.01); *C23C 28/42* (2013.01); *C23C 28/44* (2013.01); *C25D 7/001* (2013.01); *H01F 3/00* (2013.01); *H01F 10/265* (2013.01); *H01F 27/24* (2013.01); *H01F 41/26* (2013.01); *H01F 41/046* (2013.01)

(58) Field of Classification Search
USPC ............................................. 438/3
See application file for complete search history.

(56) References Cited

U.S. PATENT DOCUMENTS

| | | | | |
|---|---|---|---|---|
| 3,780,426 | A * | 12/1973 | Ono et al. | ...................... 438/357 |
| 5,483,104 | A | 1/1996 | Godinho et al. | |
| 5,969,422 | A * | 10/1999 | Ting et al. | ...................... 257/762 |
| 6,116,863 | A * | 9/2000 | Ahn et al. | ...................... 417/322 |
| 6,493,191 | B1 * | 12/2002 | Cain et al. | .................. 360/246.2 |
| 6,495,019 | B1 * | 12/2002 | Filas et al. | ..................... 205/119 |
| 7,038,470 | B1 * | 5/2006 | Johnson | ......................... 324/664 |
| 7,107,666 | B2 * | 9/2006 | Hiatt et al. | .................... 29/602.1 |
| 7,320,936 | B2 * | 1/2008 | Brunet et al. | ................. 438/678 |
| 7,389,576 | B2 * | 6/2008 | Na et al. | ........................... 29/595 |

(Continued)

FOREIGN PATENT DOCUMENTS

JP    60111312    *    6/1985

OTHER PUBLICATIONS

Jayasekara, W.P., "4 Gbit/in.2 inductive write heads using high moment FeAlN poles", Journal of Applied Physics, 79 (8), 1996, 5880-5882.

*Primary Examiner* — Reema Patel
(74) *Attorney, Agent, or Firm* — Jennifer J. Garner; Frank D. Cimino

(57) ABSTRACT

A laminated magnetic core, which has a number of magnetic layers and a number of insulation layers which are arranged so that an insulation layer lies between each vertically adjacent pair of magnetic layers, is formed in a method that forms the magnetic layers with an electroplating process, and the insulation layers with a sputter depositing process.

16 Claims, 3 Drawing Sheets

(56) References Cited

U.S. PATENT DOCUMENTS

| | | | |
|---|---|---|---|
| 7,544,995 B2* | 6/2009 | Lotfi et al. | 257/335 |
| 7,911,289 B2* | 3/2011 | Lee et al. | 333/12 |
| 8,314,400 B2* | 11/2012 | Nikolic et al. | 250/390.01 |
| 2006/0231288 A1* | 10/2006 | Vanfleteren et al. | 174/254 |
| 2008/0026464 A1* | 1/2008 | Borenstein et al. | 435/395 |
| 2009/0065361 A1* | 3/2009 | Liakopoulos et al. | 205/80 |
| 2010/0052052 A1* | 3/2010 | Lotfi et al. | 257/336 |
| 2011/0073987 A1* | 3/2011 | Mackh et al. | 257/531 |
| 2013/0062729 A1* | 3/2013 | Hopper et al. | 257/531 |

\* cited by examiner

METHOD OF FORMING A LAMINATED MAGNETIC CORE WITH SPUTTER DEPOSITED AND ELECTROPLATED LAYERS

BACKGROUND OF THE INVENTION

1. Field of the Invention

The present invention relates to laminated magnetic cores and, more particularly, to a method of forming a laminated magnetic core with sputter deposited and electroplated layers.

2. Description of the Related Art

An alternating current input to a coil generates an alternating magnetic field. One way to increase the strength of the magnetic field is to wrap the coil around a magnetic core, which is a structure that is formed from a material with a high magnetic permeability relative to air. In semiconductor fabrication processes, magnetic cores are commonly formed as thin-film structures by electroplating or sputter depositing a magnetic material.

In a typical magnetic core electroplating process, a seed layer is first sputter deposited on a substantially-planar, non-conductive surface, followed by the formation of a plating mold (e.g., a patterned photoresist layer) on the seed layer. After this, a magnetic material, such as permalloy, is electroplated to form a magnetic core on the region of the seed layer that was exposed by the plating mold. The plating mold and the seed layer lying below the plating mold are then removed.

In a typical magnetic core sputter depositing process, a target of magnetic material, such as a permalloy target, is bombarded with energetic particles, such as ions. The energetic particles, in turn, cause the target of magnetic material to eject atoms, such as permalloy atoms, which are then deposited on a substantially-planar, non-conductive surface.

One significant advantage of electroplating over sputter depositing a material is that the deposition rate of an electroplated material is substantially greater than the deposition rate of a sputter deposited material. For example, the deposition rate of an electroplated material can be upwards of 1 µm per minute, whereas the deposition rate of a sputter deposited material can be upwards of 4 µm per hour.

Thus, to form a magnetic core that is 4 µm thick, it can take an hour or more to sputter deposit the material compared to 4 minutes or more to electroplate the same amount of material. The difference in deposition rate, however, is not the only consideration when forming a magnetic core.

Another important consideration is the frequency of the alternating current that is to be input to the coil. As the frequency of the alternating current increases, eddy currents generated within the coil reduce the amount of alternating current that can flow through the center of the coil, thereby generating an alternating current resistance.

In addition, as the frequency of the alternating current increases, eddy currents generated within the magnetic core also substantially increase the alternating current resistance of the coil. Further, as the thickness of the magnetic core increases, the magnitude of the alternating current resistance from the magnetic core increases at a much greater rate.

Thus, the higher the frequency, the greater the alternating current resistance becomes. For example, given a magnetic core that is 4 µm thick, an alternating current with a frequency of 10 MHz experiences a substantially larger alternating current resistance than does an alternating current with a frequency of 100 KHz.

To reduce the alternating current resistance that results from eddy currents in the magnetic core, laminated magnetic cores are typically utilized. A laminated magnetic core is a type of magnetic core that has layers of magnetic material and layers of non-conductive material which are arranged such that each vertically adjacent pair of magnetic layers is separated by a non-conductive layer.

Laminated magnetic cores are commonly formed by sputter depositing an initial layer of magnetic material onto a substantially-planar, non-conductive surface. After the initial layer of magnetic material has been sputter deposited, a layer of non-conductive material followed by a layer of magnetic material are repeatedly sputter deposited until the required core thickness has been obtained. The last sputter deposited layer forms a stack of layers. The stack of layers is then masked and etched to form a laminated magnetic core.

With laminated magnetic cores, each layer of magnetic material in the stack is thin enough to substantially reduce the eddy currents generated in the magnetic layer at the alternating current frequency. As a result of substantially reducing the eddy currents in the magnetic core, the alternating current resistance of the coil at higher frequencies can be substantially reduced.

However, one drawback of sputter-deposited laminated magnetic cores is that it takes a significant amount of time to form a laminated magnetic core (e.g., two and one-half hours or more to form a core 10 µm thick). Another drawback is that each layer in a sputter-deposited laminated magnetic core increases the stress of the stack. Thus, thick laminated magnetic cores (e.g., 10 µm thick or thicker) formed by sputter deposition have significant stress levels which, in turn, substantially increase the likelihood of device failure.

One approach to reducing the time required to form a laminated magnetic core begins by forming a first electroplated magnetic structure on a non-conductive structure in a conventional manner (e.g., deposit a seed layer on the non-conductive structure, form a plating mold on the seed layer, electroplate, and remove the plating mold and the seed layer lying below the plating mold).

After the first electroplated magnetic structure has been formed, a polymer structure, such as an SU-8 structure, is formed to cover the first magnetic structure. After the polymer structure has been formed, a second electroplated magnetic structure is formed in a conventional manner on the polymer structure (e.g., deposit a seed layer on the polymer layer, form a plating mold on the seed layer, electroplate, and remove the plating mold and the seed layer lying below the plating mold). The process of forming a polymer layer followed by the conventional formation of an electroplated magnetic structure then continues until the required thickness of the magnetic core has been obtained.

One drawback of this approach is that the approach utilizes a different plating mold to form each magnetic layer. The plating molds, in turn, are typically implemented as patterned photoresist layers, which are relatively expensive to form in a semiconductor fabrication process. Thus, although faster, this approach is quite expensive. As a result, there is a need for a fast inexpensive approach to forming laminated magnetic cores.

DETAILED DESCRIPTION OF THE INVENTION

FIGS. 1A-1D show views that illustrate an example of a method of forming a laminated magnetic core in accordance with the present invention. Although the laminated magnetic core of the present invention is utilized in conjunction with a coil, the specifics of the coil are omitted for simplicity.

Figure 1A:
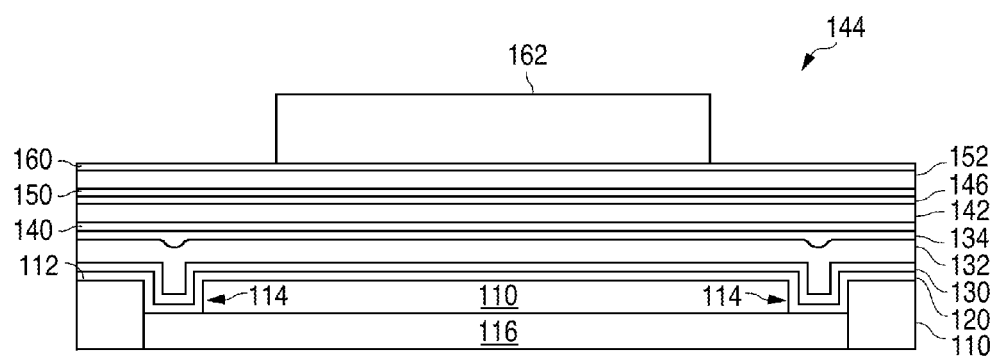
FIGS. 1A-1D are views illustrating an example of a method of forming a laminated magnetic core in accordance with the present invention.

As shown in FIG. 1A, the method of the present invention utilizes a non-conductive structure 110 that has a substantially-planar top surface 112. Non-conductive structure 110 can be implemented with any material which has good dielectric properties. For example, a layer of photoimageable epoxy or polymer, such as SU-8, which has a relatively low stress and a low coefficient of thermal expansion, can be used. Materials such as SU-8 are substantially self planarizing.

In some embodiments, as illustrated in the present example, non-conductive structure 110 has openings 114 that expose underlying conductive structures 116, such as coil segments. (Only one conductive structure 116 is shown for simplicity.) When non-conductive structure 110 has openings 114, the method optionally begins by sputter depositing in a conventional manner an etch stop layer 120, such as a titanium layer, onto the top surface 112 of non-conductive structure 110 to line the openings 114.

The method continues following the formation of etch stop layer 120 (or begins if etch stop layer 120 is not formed) by sputter depositing a seed layer 130 in a conventional manner onto the top surface of etch stop layer 120. After seed layer 130 has been formed, a magnetic material is electroplated in a conventional manner to form a magnetic layer 132 on the top surface of seed layer 130.

Following the formation of magnetic layer 132, an insulation layer 134 is sputter deposited in a conventional manner onto the top surface of magnetic layer 132. Once insulation layer 134 has been formed, a seed layer 140 is sputter deposited in a conventional manner onto the top surface of insulation layer 134. After seed layer 140 has been formed, a magnetic material is electroplated in a conventional manner to form a magnetic layer 142 on the top surface of seed layer 140.

The sequence of sputter depositing an insulation layer and then sputter depositing a seed layer, followed by electroplating a magnetic material, then continues until a stack of layers 144 has been formed that provides the required thickness of the magnetic core. In the FIG. 1A example, the stack of layers 144 also includes an insulation layer 146 sputter deposited onto the top surface of magnetic layer 142, and a seed layer 150 sputter deposited onto the top surface of insulation layer 146. Further, the stack of layers 144 in the present example also includes a magnetic material electroplated to form a magnetic layer 152 on the top surface of seed layer 150.

Each of the insulation layers (e.g., layers 134 and 146) in the stack of layers 144 is implemented with a non-conductive material, which can be selected to be compatible with the etch chemistry that will subsequently be used to etch the stack of layers 144. For example, AlN is a non-conductive material that can be wet etched using a mixture of phosphoric acid, acetic acid, and nitric acid, or a nitric-acid-based mixture.

In addition, each of the seed layers (e.g., layers 130, 140, and 150) in the stack of layers 144 can be implemented with a magnetic material such as permalloy or CoNiFe. Further, to minimize eddy currents, each of the seed layers (e.g., layers 130, 140, and 150) in the stack of layers 144 can be implemented with a magnetic material that has a large resistance (e.g., 50× more resistance than Cu). For example, the seed layers 130, 140, and 150 can be implemented with amorphous CoTaZr or amorphous CoNbZr. Utilizing a magnetic seed layer effectively increases the cross-sectional area of the magnetic core. Alternately, each of the seed layers 130, 140, and 150 in the stack of layers 144 can be implemented with a non-magnetic material, such as a Ti layer with an overlying Cu layer.

Further, each of the magnetic layers (e.g., layers 132, 142, and 152) in the stack of layers 144 is electroplated to have a thickness which substantially reduces eddy currents at the frequency of the alternating current that is to be input to the coil. Each of the magnetic layers can be implemented with any soft, low-coercivity magnetic material such as NiFe (e.g., permalloy and orthonol) or CoFe.

In addition, the higher the resistivity of the magnetic layers in a laminated magnetic core, the thicker the magnetic layers can be which, in turn, increases the amount of high-deposition-rate electroplated magnetic material that is deposited, and reduces the number of magnetic layers that need to be used (thereby shortening the fabrication time). As a result, other elements, such as Cr and B, or additives such as sulfer-based or carbon-based additives, can be added to the magnetic material to increase the resistance.

After the last layer (magnetic layer 152 in the present example) in the stack of layers 144 has been formed, a protection layer 160 can optionally be sputtered deposited onto the top surface of the last layer of the stack of layers 144. Protection layer 160, which has a different composition than the composition of the magnetic layers in the stack of layers 144, can be implemented with, for example, a Ti layer.

Protection layer 160 can be used when etch stop layer 120 has been formed. In subsequent steps, protection layer 160 is etched to leave a protective cover. In another subsequent step, the protective cover and the exposed region of etch stop layer 120 are removed. Without the protective cover, the etchant used to remove etch stop layer 120 would also attack the last layer in the stack of layers 144. However, with the protective cover, etch stop layer 120 and the protective cover are removed at the same time, with the protective cover protecting the last layer in the stack of layers 144 throughout most of the process.

After protection layer 160 has been formed (or after the stack of layers 144 has been formed when protection layer 160 is not formed), a patterned photoresist layer 162 is next formed on the top surface of protection layer 160 (or the last layer in the stack of layers 144 when protection layer 160 is not formed).

Figure 1B:
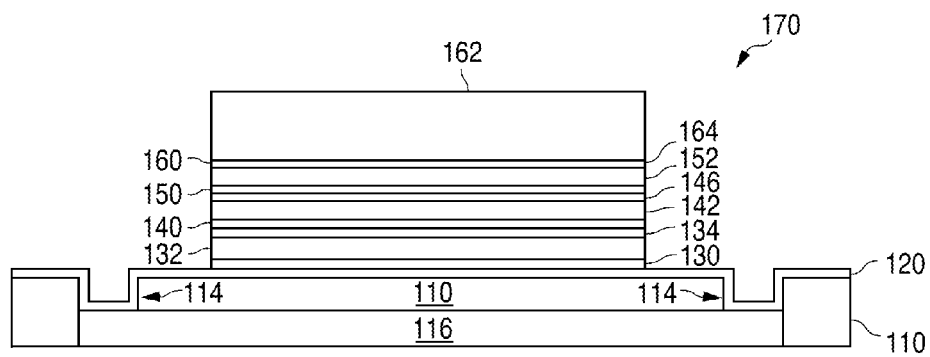

As shown in FIG. 1B, after patterned photoresist layer 162 has been formed, protection layer 160 is first etched when present to form a protective cover 164. After this, the exposed regions of magnetic layer 152, and the underlying regions of seed layer 150, insulation layer 146, magnetic layer 142, seed layer 140, insulation layer 134, magnetic layer 132, and seed layer 130, are wet etched in a conventional manner to form a laminated magnetic core 170. For example, AlN insulation layers, amorphous CoTaZr seed layers, and CoNiFe magnetic layers can each be etched with the same mixture of phosphoric acid, acetic acid, and nitric acid, or a nitric-acid-based mixture.

Figure 1C:
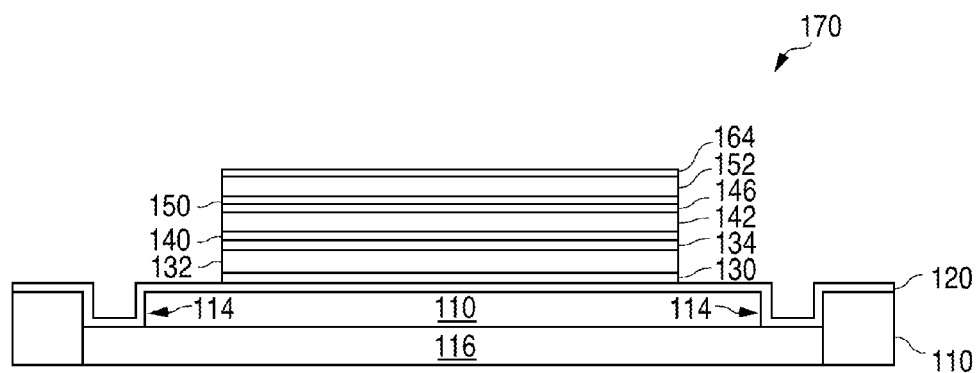
Figure 1D:
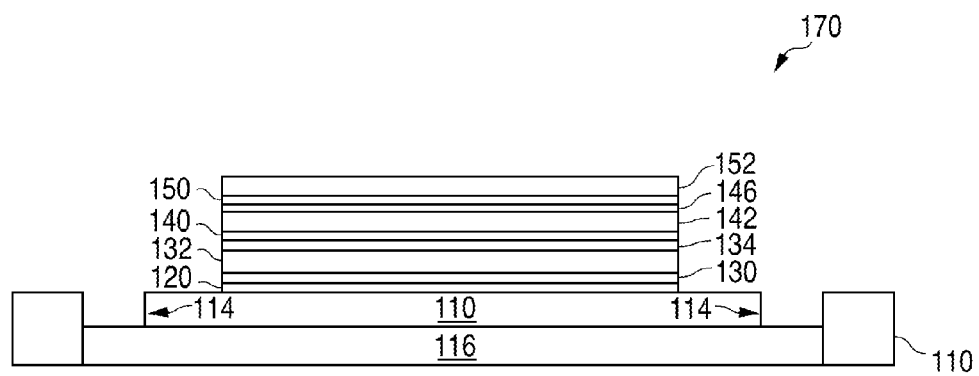

Following the formation of laminated magnetic core 170, as shown in FIG. 1C, patterned photoresist layer 162 is removed with conventional solvents and processes. After patterned photoresist layer 162 has been removed, as shown in FIG. 1D, protective cover 164 and the exposed region of etch stop layer 120 are removed when present in a conventional manner.

One of the advantages of the present example is the ability to introduce the insulation layers while maintaining an overall high deposition rate. This captures the advantages of both sputter depositing and electroplating. In other words, by sputter depositing a seed layer after an insulation layer has been sputter deposited, the magnetic layer can be formed utilizing the much faster electroplating process instead of the much slower sputter deposition process.

Another advantage of the present example is that a laminated magnetic core can be formed utilizing a single patterned photoresist layer rather than a different patterned photoresist layer for each magnetic structure in the magnetic core. In addition, the present example utilizes a wet etch that is inexpensive and can be simultaneously used on a large number of wafers at the same time. As a result, the present example provides a fast inexpensive approach to forming laminated magnetic cores.

For example, thick laminated magnetic cores (e.g., laminated magnetic cores that are 10 µm and larger) can be formed in accordance with the present example in substantially less time or with substantially less cost than it would take to form a laminated magnetic core of the same thickness using other approaches.

A further advantage of the present example is that an electroplated magnetic layer typically has a tensile stress. The stress of a sputtered layer can be compressive by controlling the deposition conditions. As a result, the tensile stress of an electroplated magnetic layer can oppose the compressive stress of the sputter deposited layers. Thus, the stress associated with laminated magnetic core 170 is substantially less than the stress that would be associated with a conventionally-formed, sputter-deposited magnetic core of the same thickness.

Figure 2A:
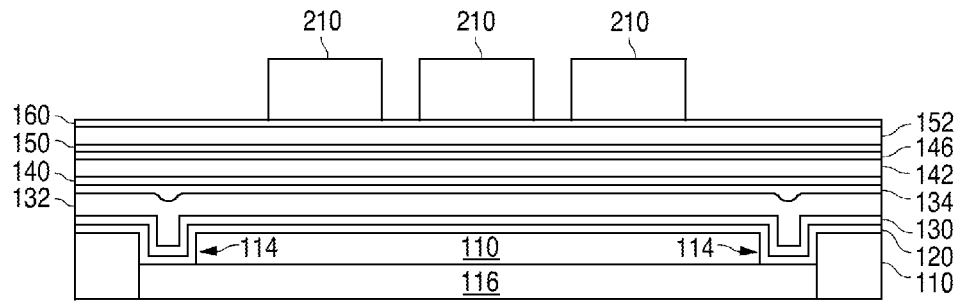
FIGS. 2A-2C are cross-sectional views illustrating an example of an alternate method of forming a laminated magnetic core in accordance with the present invention.
Figure 2B:
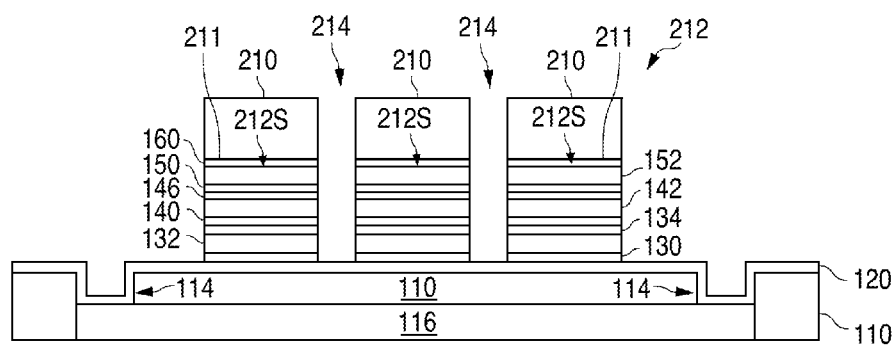
Figure 2C:
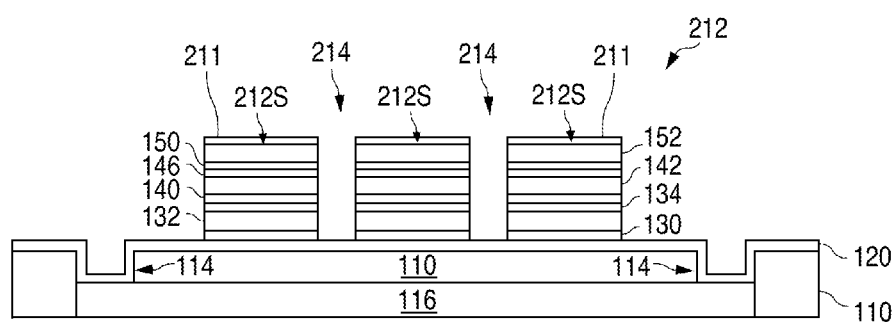

FIGS. 2A-2C show cross-sectional views that illustrate an example of an alternate method of forming a laminated magnetic core in accordance with the present invention. As shown in FIG. 2A, the alternate method is the same as the method of FIGS. 1A-1D except that a patterned photoresist layer 210 is formed in lieu of patterned photoresist layer 162.

After patterned photoresist layer 210 has been formed, the method continues as with the method of FIGS. 1A-1D except that, as shown in FIG. 2B, protection layer 160 is first etched when present to form a number of spaced-apart protective covers 211. After this, the exposed regions of magnetic layer 152, and the underlying regions of seed layer 150, insulation layer 146, magnetic layer 142, seed layer 140, insulation layer 134, magnetic layer 132, and seed layer 130, are wet etched in a conventional manner to form a magnetic core 212.

As further shown in FIG. 2B, magnetic core 212 has a number of spaced-apart horizontally-adjacent magnetic core segments 212S with gaps 214 that lie between each horizontally adjacent pair of magnetic core segments 212S. The gaps 214, in turn, form vertical air insulators that further reduce the eddy currents in magnetic core 212 by further reducing the space available for the eddy currents to flow. As shown in FIG. 2C, after the wet etch, patterned photoresist layer 210 is removed in a conventional manner. Following this, the protective covers 211 and the exposed region of etch stop layer 120 are removed when present in a conventional manner.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a magnetic core comprising:
providing a substrate of a semiconductor structure overlayed by a non-conductive structure that has a substantially-planar top surface, wherein the non-conductive structure is implemented with a negative self planarizing photoresist, wherein the non-conductive structure includes openings that expose underlying conductive structures;
sputter depositing an etch stop layer onto the top surface of the non-conductive structure to line the openings that expose underlying conductive structures;
sputter depositing a first seed layer onto the top surface of the etch stop layer on the semiconductor structure;
electroplating a first layer of magnetic material to form a first magnetic layer on the top surface of the first seed layer;
sputter depositing a second non-conductive layer to touch the first magnetic layer;
sputter depositing a second seed layer to touch the second non-conductive layer; and
electroplating a second layer of magnetic material to form a second magnetic layer on the top surface of the second seed layer;
wherein continuing the sequence of sputter depositing an insulation layer and then sputter depositing a seed layer, followed by electroplating a magnetic material, then continuing until a stack of layers has been formed, the stack of layers being completed when an insulation layer has been sputter deposited onto the top surface of the last magnetic layer, and a top seed layer has been sputter deposited onto the top surface of the last insulation layer, further, the stack of layers also includes a magnetic material electroplated to form a magnetic layer on the top surface of the top seed layer.

2. The method of claim 1 and further comprising etching the second magnetic layer, the second seed layer, the first non-conductive layer, the first magnetic layer, and the first seed layer to form a magnetic core.

3. The method of claim 1 and further comprising:
sputter depositing a second non-conductive layer to touch the second magnetic layer;
sputter depositing a third seed layer to touch the second non-conductive layer; and
electroplating a third magnetic layer to touch the third seed layer.

4. The method of claim 3 and further comprising etching the third magnetic layer, the third seed layer, the second non-conductive layer, the second magnetic layer, the second seed layer, the first non-conductive layer, the first magnetic layer, and the first seed layer to form a magnetic core.

5. The method of claim 4 wherein the first, second, and third magnetic layers each has a high resistance.

6. The method of claim 5 wherein the first, second, and third seed layers each has a high resistance.

7. The method of claim 4 wherein the third magnetic layer, the third seed layer, the second non-conductive layer, the second magnetic layer, the second seed layer, the first non-conductive layer, the first magnetic layer, and the first seed layer are each etched with a mixture that includes nitric acid.

8. The method of claim 4 and further comprising forming a protective layer to touch the third magnetic layer, the protective layer having a different metallic composition than the first, second, and third seed layers and the first, second, and third magnetic layers.

9. The method of claim 8 wherein the semiconductor structure has an opening that exposes a conductive structure.

10. The method of claim 1 and further comprising removing an exposed region of the etch stop layer after the magnetic core has been formed.

11. The method of claim 1, wherein the method consists of a single patterning process that uses a single patterned photoresist layer to etch each of the stack of layers to form the magnetic core.

12. The method of claim 8, wherein the method consists of a patterning process that uses a single patterned photoresist layer to form the magnetic core, further comprising forming the single patterned photoresist layer on the protective layer and using the single patterned photoresist layer as an etch mask for a first etch to form a plurality of number of spaced-apart protective covers, and using the single patterned photoresist layer as an etch mask for a second etch to form each of the stack of layers so that the magnetic core includes a plurality of spaced-apart horizontally-adjacent magnetic core segments with gaps that lie between each horizontally adjacent pair of the magnetic core segments.

13. The method of claim 12, wherein the second etch comprises a wet etch.

14. The method of claim 13, wherein the wet etch comprises phosphoric acid, acetic acid, nitric acid, or a nitric acid-based mixture.

15. The method of claim 1, wherein the first seed layer, the second seed layer and the top seed layer each comprise a magnetic seed layer.

16. A method of forming a magnetic core comprising:
providing a substrate of a semiconductor structure overlayed by a non-conductive structure that has a substantially-planar top surface, wherein the non-conductive structure is implemented with a negative self planarizing photoresist, wherein the nonconductive structure includes openings that expose underlying conductive structures;
sputter depositing an etch stop layer onto the top surface of the non-conductive structure to line the openings that expose underlying conductive structures;
sputter depositing a first seed layer onto the top surface of the etch stop layer on the semiconductor structure;
electroplating a first layer of magnetic material to form a first magnetic layer on the top surface of the first seed layer;
sputter depositing a second non-conductive layer to touch the first magnetic layer;
sputter depositing a second seed layer to touch the second non-conductive layer; and
electroplating a second layer of magnetic material to form a second magnetic layer on the top surface of the second seed layer;
wherein continuing the sequence of sputter depositing an insulation layer and then sputter depositing a seed layer, followed by electroplating a magnetic material, then continuing until a stack of layers has been formed the stack of layers being completed when an insulation layer has been sputter deposited onto the top surface of the last magnetic layer, and a top seed layer has been sputter deposited onto the top surface of the last insulation layer, further, the stack of layers also includes a magnetic material electroplated to form a magnetic layer on the top surface of the top seed layer, and
wherein the method consists of a single patterning process that uses a single patterned photoresist layer to etch each of the stack of layers to form the magnetic core.

* * * * *